United States Patent [19]

Reuter et al.

[11] Patent Number: 4,651,863

[45] Date of Patent: Mar. 24, 1987

[54] SYSTEM FOR ASSEMBLING ELECTRONIC COMPONENT KITS

[75] Inventors: Howard A. Reuter, Pasadena; Dennis D. Murphey, Westminster, both of Md.

[73] Assignee: Westinghouse Electric Corp., Pittsburgh, Pa.

[21] Appl. No.: 790,765

[22] Filed: Oct. 23, 1985

Related U.S. Application Data

[63] Continuation of Ser. No. 528,022, Aug. 31, 1983, abandoned.

[51] Int. Cl.⁴ .............................................. B65G 1/00
[52] U.S. Cl. .............................. 198/339.1; 198/465.1; 414/223; 414/225; 414/280; 414/283; 414/331; 414/416; 414/661; 414/787
[58] Field of Search ............... 414/222, 223, 225, 226, 414/273, 277, 280, 283, 331, 662, 665, 666, 787, 416, 282, 266, 661; 198/339.1, 346.1, 465.1; 53/155, 238

[56] References Cited

U.S. PATENT DOCUMENTS

| | | | |
|---|---|---|---|
| 3,486,640 | 12/1969 | Lemelson | 414/283 |
| 3,490,616 | 1/1970 | Castaldi | 414/282 X |
| 3,734,310 | 5/1973 | Miller | 414/273 |
| 3,854,604 | 12/1974 | Peterson et al. | 414/277 |
| 3,881,605 | 5/1975 | Grossman | 414/416 X |
| 3,883,008 | 5/1975 | Castaldi | 414/280 X |
| 4,389,157 | 6/1983 | Bernard et al. | 414/787 |
| 4,466,765 | 8/1984 | Mautino | 414/277 |
| 4,557,655 | 12/1985 | Berg | 414/226 X |
| 4,561,820 | 12/1985 | Matheny, III et al. | 414/331 |

Primary Examiner—Joseph E. Valenza
Assistant Examiner—David A. Bucci
Attorney, Agent, or Firm—W. G. Sutcliff

[57] ABSTRACT

A system for machine assembly of component kits for electronic printed circuit boards is disclosed. Components for assembling the kits are stored in a plurality of standardized machine recoverable trays, more specifically a multi-level carousel. An elevator transports trays between storage and an automated work station where components are removed to construct the component kits.

2 Claims, 9 Drawing Figures

SYSTEM FOR ASSEMBLING ELECTRONIC COMPONENT KITS

This application is a continuation of application Ser. No. 582,022, filed Aug. 31, 1983, now abandoned.

BACKGROUND OF THE INVENTION

Field of the Invention

The invention relates to automated systems and more specifically to automated systems for constructing component kits for electronic printed circuit boards.

SUMMARY OF THE INVENTION

Functionally the system provides means for storing components, such as electronic components for example, in a plurality of drawer-like containers and removing these components one-at-a-time for use in assembling component kits to be used in constructing electronic circuit boards. In the experimental model, each of the trays were labeled with machine readable code such as a bar code which identifies the components stored in the tray. A repositionable support system, such as a rotating carousel, supports a plurality of the trays such that under the control of a digital computer a selected tray is positioned at a predetermined recovery position by rotating the carousel. Identification of the component stored in the drawer is accomplished by machine reading the bar code on the front of the drawer. Assuming, successful identification of the component, tray removal and insertion apparatus removes the tray from the storage location and inserts in its place a previously used tray which may be used to store a component of an entirely different type. Since the component (type) stored in any location may change each time a tray is removed, a dynamic component data base is maintained in the control computer to maintain a current component location index.

Each tray removed is transported, as necessary, to a location where the required number of components are removed. During the time when the components are being removed, the next tray to be used is removed from storage and the previously used tray is stored in the same location.

In the experimental model, the carousel includes a plurality of levels with each level capable of independently rotating in either direction. A plurality of bins each containing 90 trays arranged in five columns were used. A control computer rotated the carousel to position the tray to be recovered at the recovery point. An elevator transports the trays between storage and a work station where the component kits are assembled.

DESCRIPTION OF THE PREFERRED EMBODIMENT

Figure 2:
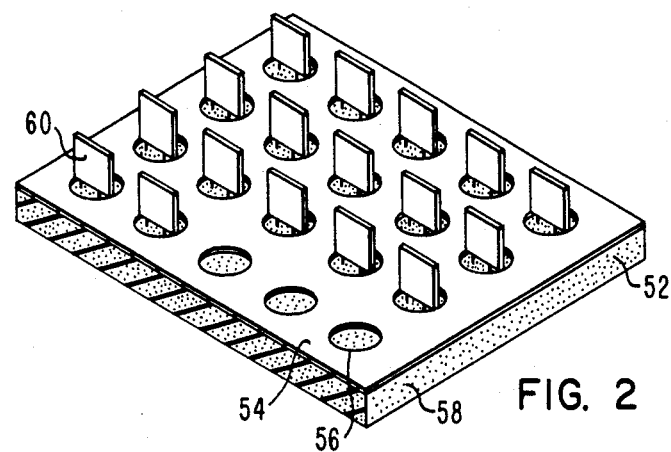
FIG. 2 is a drawing of a component support structure.

Functionally, the invention provides apparatus enabling components, in the experimental model electronic components, to be removed from storage and assembled to form component kits for electronic printed circuit boards. More specifically, in the case of electronic components, all components are stored in standardized trays with a typical tray illustrated at reference numeral 20, FIG. 1. A typical tray 20 may be approximately 16"×4"×1".

For the purpose of storing axial components, such as resistors for example, two substantially vertical notched rails, 22 and 24, are affixed to the bottom surface of the tray 20. Leads of components to be stored have sufficient length to permit the components to be suspended between the rails, 22 and 24, with the leads resting in similarly positioned notches of rails, 22 and 24. Typical resistors 26, 28, 29, 30 and 32 are illustrated in their stored position, in FIG. 1.

The front end of the tray 20 includes a handle portion 34 which permits each of the trays to be conveniently removed from a standardized storage bin, illustrated in fragmentary view at reference numeral 40. (Storage bin 40 will be subsequently described in detail.) A flat face portion of the handle 34 provides a convenient location for a standard bar code 42 which uniquely identifies the component stored in the associated storage tray. The end of tray 20 opposite the handle portion 34 is either rounded (curved) or tapered in both the horizontal and vertical directions (horizontal meaning substantially parallel to the bottom surface of tray 20). Functionally this provides for a self-aligning action as the trays are inserted into slots in the bin 40. That is, if the tray is misaligned slightly in either or both of the horizontal or vertical directions as an attempt is made to insert the tray, the curved surfaces of the end of the tray 20 will contact the edge of the slot and exert a force on the tray 20 which tends to force the tray 20 into the proper position for insertion.

A plurality of trays, the tray illustrated at reference numeral 20 being typical, are stored in columns in bin 40. Other exemplary trays are illustrated at reference numerals 20a–20e.

If components having one or more leads extending from a common surface (often referred to as radial components) such as small capacitors or transistors are to be stored some support structures other than the rails, 22 and 24, must be provided. One convenient structure is illustrated in FIG. 2 at reference numeral 52. The structure includes an upper sheet-like member 54 which may conveniently be sheet metal having a plurality of circular openings therein, with a typical opening illustrated at reference numeral 56. Affixed to the under surface of the member 54 is a resilient layer which may be a layer of silicone rubber, illustrated at reference numeral 58. Any suitable technique may be used to affix the support structure 52 to the bottom surface of a typical storage tray 20.

Components are stored in the support structure 52 by positioning the components to be stored such that the leads contact the upper surface of the resilient layer 58 in an area exposed by an opening in the sheet metal layer 58 and applying sufficient force to cause the leads to penetrate the surface of the resilient layer 52. Experiments have shown that silicone rubber has sufficient durablity to permit repeated use of this type of structure. Other structures providing the proper support can also be used.

Typical components are illustrated in FIG. 2 with one member of the illustrated group identified by reference numeral 60.

Figure 1:
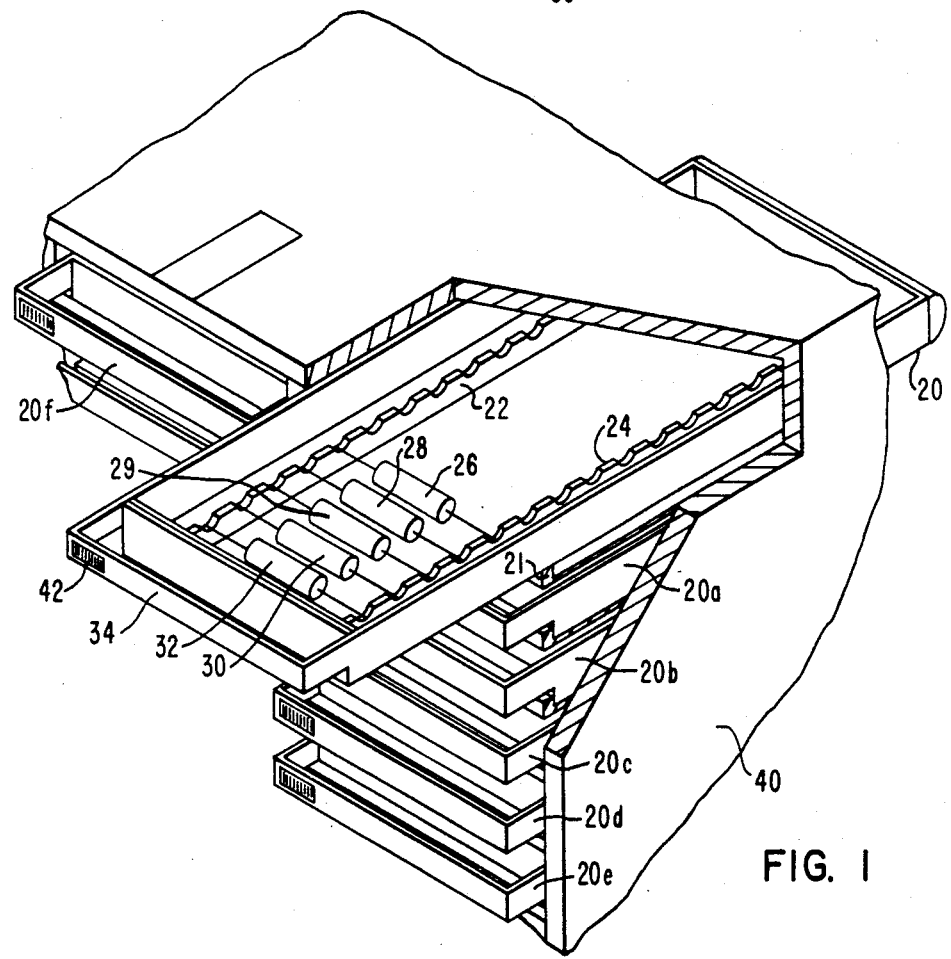
FIG. 1 is a drawing illustrating a storage tray and a fragmentary view of a storage bin.
Figure 3:
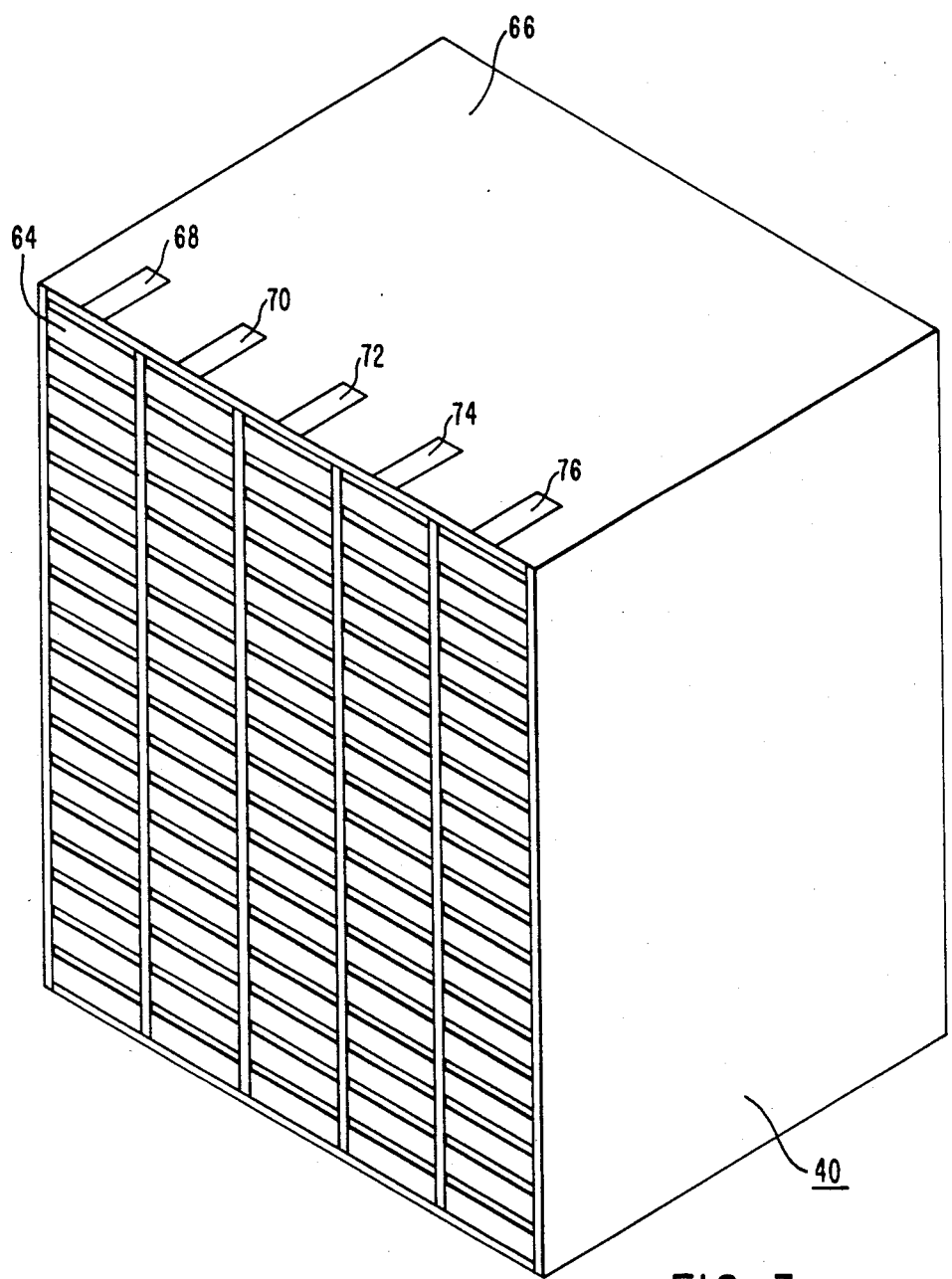
FIG. 3 is a drawing of a storage bin.

Storage and support means for the trays is provided by a storage bin 40 illustrated in FIG. 3 and in fragmentary view at reference numeral 40 of FIG. 1. In the experimental model, the storage bin provided space for storing ninety trays arranged in five columns of eighteen trays each. Each tray was provided with an individual storage slot with a typical slot being identified in front view at reference numeral 64. In use, as subsequently described in detail, it is necessary to position the storage bin accurately in order to remove and insert storage trays in the storage slots. To permit this to be done, the upper surface 66 of the storage bin includes positioning markers 68-76 each respectively associated with a column of the storage bin. Preferably, the markers are centered above each column of storage trays, however other locations could also be used, for example the edge of each column of trays.

Figure 4:
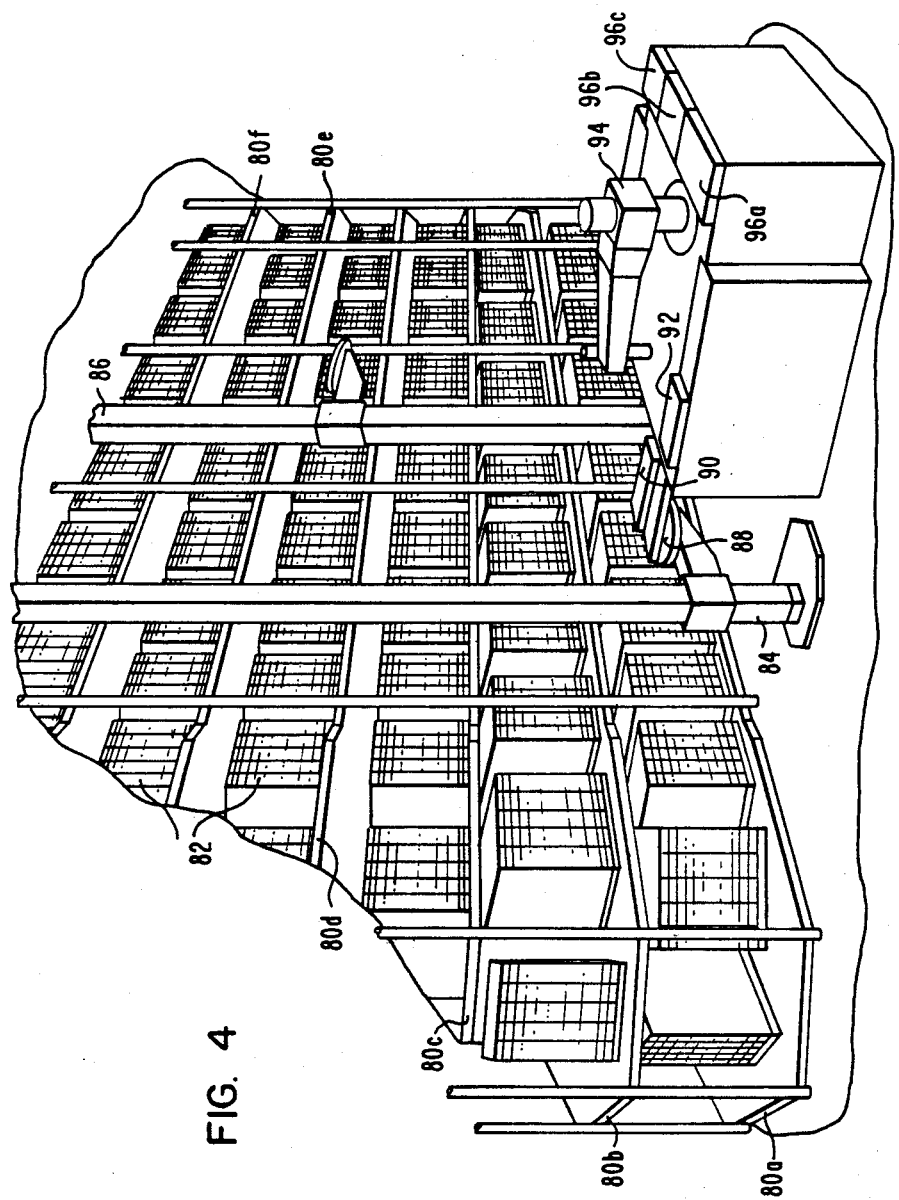
FIG. 4 is a fragmentary pictorial view of the system comprising the preferred embodiment of the invention.

The system comprising the preferred embodiment of the invention is illustrated in a partial fragmentary pictorial view in FIG. 4. A multi-level rotary commercially available carousel provides on each level space for a plurality of storage bins of the type illustrated in FIG. 3. In FIG. 4 six levels of the carousel are respectively illustrated at reference numerals 80a through 80f. Positioned on each level, 80a through 80f, is a plurality of storage bins, of the type illustrated in FIG. 3, with a typical bin being on level 80d identified by reference numeral 82. Vertical access to any storage bin and any tray within a bin is provided by rotating the appropriate level of the carousel containing the tray to be recovered until the storage tray to be recovered is positioned in front of an elevator, the first of two elevators identified by reference numeral 84, for example. A turntable mechanism 88 is moved to a position immediately in front of the tray to be recovered using the associated elevator, as subsequently described. A tray gripper mechanism positioned on the turntable engages the handle, 34 (FIG. 1) of the typical tray to be removed. A lifting motion is used to lift the tray to be removed such that the bottom surface of the tray is lifted above the retaining ledge 21 (FIG. 1). Tray extraction is completed by sliding the tray onto the upper surface of the turntable mechanism.

Following removal of the tray from the storage bin, the turntable mechanism 88 rotates approximately 180° and a tray from which components were previously removed to construct component kits is inserted into the slot from which the tray was removed using the above sequence of actions in reverse. Thus, each trip of the elevator performs a dual function, i.e. extracts from storage the tray in which the next components to be used in assembling component kits are stored and returns to storage a tray from which components were previously removed. Since the tray extraction process described above is generic, that is it enables any tray stored on any level of the carousel to be recovered, no reference number was used to identify specific trays in that such specific identification might lead to confusion rather than clarification.

Following extraction of a tray from storage, the turntable mechanism 88 returns to the work station level as illustrated in FIG. 4. At the work station, a tray 90 from which components have been previously removed to form component kits is slid onto turntable mechanism 88, the turntable rotates approximately 180° and the tray 92 which was removed from storage during the above described tray extraction cycle is slid onto the platform of the work station. At the work station a robot 94 removes components from the tray 92, trims and bends the leads as required and places the properly prepared components into one or more of the component kits, 96a-96c. The process is continued until the component kits 96a-96c contain the required number and types of components.

For purpose of simplicity of description the operation of the system was described above using a single elevator 84. The second elevator 86 is identical to elevator 84 and supplies components to the robot 94 in an identical manner except from the opposite side. Operation of the two elevators, 84 and 86 can be alternated, that is while one elevator is delivering a tray to the robot 94 the other elevator is recovering the next tray to be used. This permits a substantially continuous supply of components to be available to the robot 94 and substantially eliminates dead-time caused by the required components not being available to the robot 94.

Figure 5:
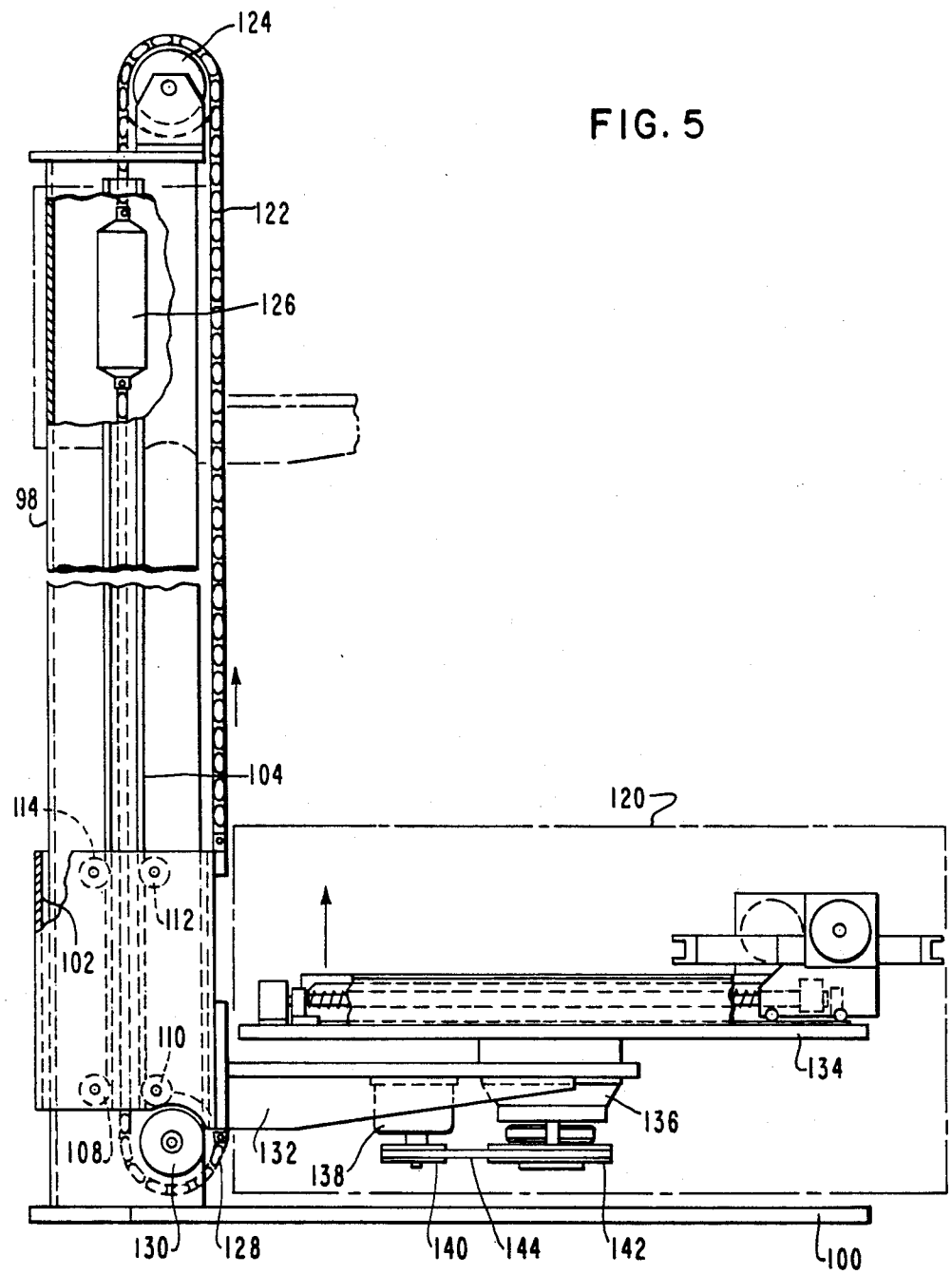
FIG. 5 is a side view of the elevator.
Figure 6:
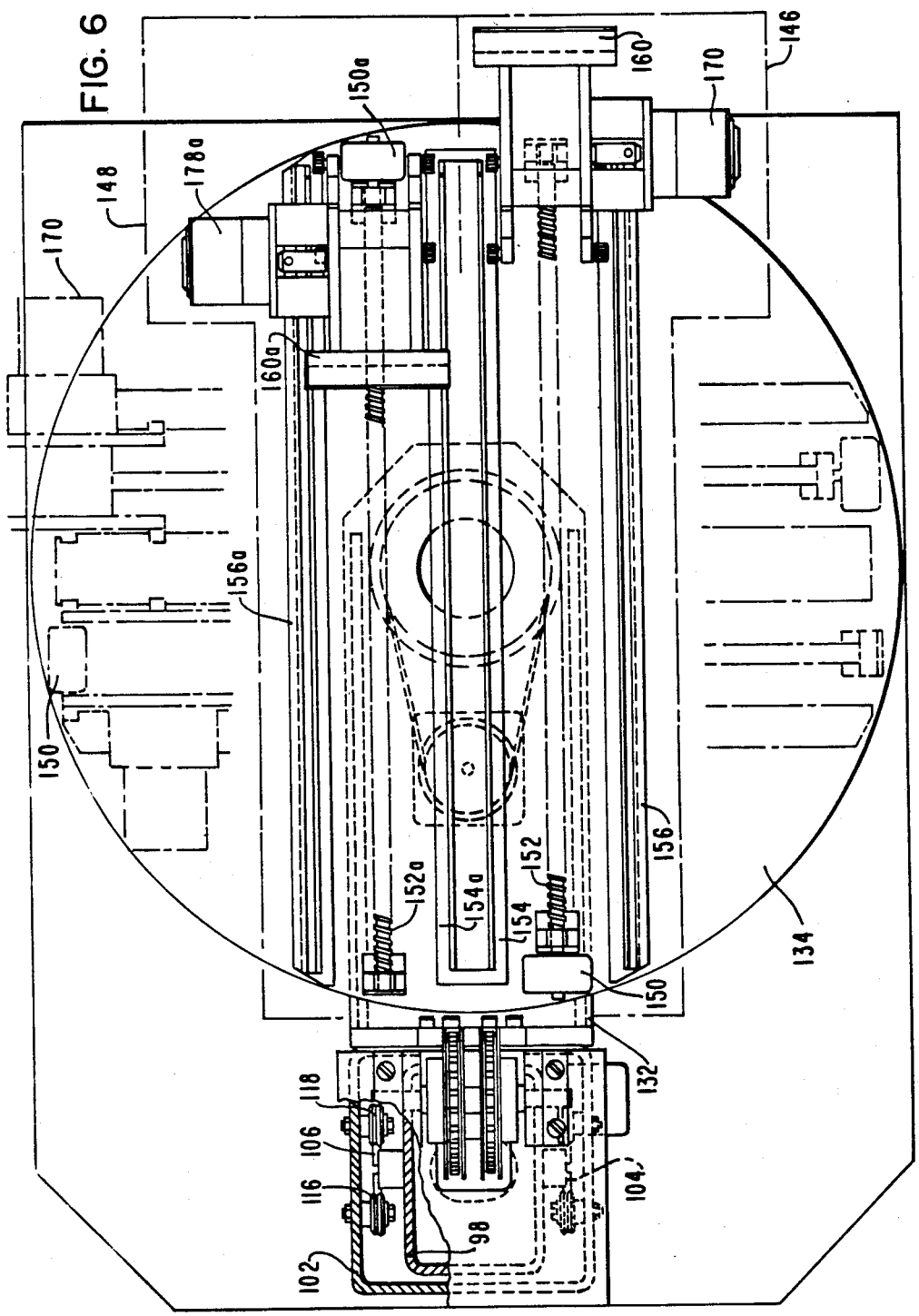
FIG. 6 is a top view of a turntable.

An elevator of the type illustrated at reference numerals, 84 and 86, of FIG. 4 is illustrated in side view in FIG. 5 with selected portions being shown in top view in FIG. 6.

A rectangular (cross-section) vertical member 98 is affixed by welding to a base plate 100. Positioned about rectangular member 98 is a collar member 102. Rails, 104 and 106, are affixed to opposite vertical surfaces of support member 98. Four substantially identical rollers 108, 110, 112, 114 are affixed to the inner surface of collar 102 such that they engage opposite edges of rail 104. Similarly, four additional rollers with the top two being illustrated at reference numerals, 116 and 118, in FIG. 6 engage rail members 106. This arrangement permits the collar member 102 to move up and down support member 98.

A turntable mechanism, shown within the rectangular outline 120 (FIG. 5), is affixed to the collar member 102. A first section of drive chain 122 affixed to the upper edge of collar 102 extends upward and around an idler sprocket 124, and has its second end affixed to the top end of a counterweight 126. Similarly, a second section of drive chain 128 is affixed to the bottom edge of collar member 102, extends downward around a drive sprocket 130, and has its second end affixed to the bottom end of counterweight 126. Rotating drive sprocket 130 by a direct coupled drive motor or other suitable means causes the turntable mechanism 120 to move up and down to position the turntable mechanism 120 to manipulate the storage trays as previously described.

The turntable mechanism 120 is illustrated in top view in FIG. 6 in its relationship to support column 98 and collar member 102. More specifically a turntable support bracket 132 is affixed to the collar member 102 and extends outwardly from the support column 98 at approximately ninety degrees. A turntable 134 is supported to rotate by a bearing and support mechanism 136 (FIG. 5). Mechanical drive to the turntable 130 is provided by a motor 138, through pulleys, 140 and 142, and a belt 144.

Supported on the upper surface of the turntable 134 are first and second substantially identical storage tray handling mechanisms 146 and 148. A drive motor 150 drives a lead screw 152 causing the tray gripper 160 to be driven back and forth along rails 154 and 156. The rails, 154 and 156, also provide support for the trays while they are partially or fully positioned on the turntable 134. As shown in FIG. 6, tray gripper 160 is in the extended position. This is the position utilized to either insert a storage tray in a storage bin or to slide a storage tray from the turntable 134 onto the work station.

As previously discussed tray handling mechanisms 146 and 148 are identical except that they are oriented in opposite directions. Therefore, the reference numerals used to identify parts of tray handling mechanism 146 followed by a letter "a" are used to identify the same parts in tray handling mechanism 148.

Tray handling mechanism 148 is shown in the position where any tray held by the tray gripper 160a would be fully positioned on the turntable 134 and supported by rails 154a and 156a. This is the position for transporting trays between the work station and the storage bins. The turntable mechanism is also partially shown in dotted lines as rotated into a position to insert and extract trays from the storage bins.

Figure 6A:
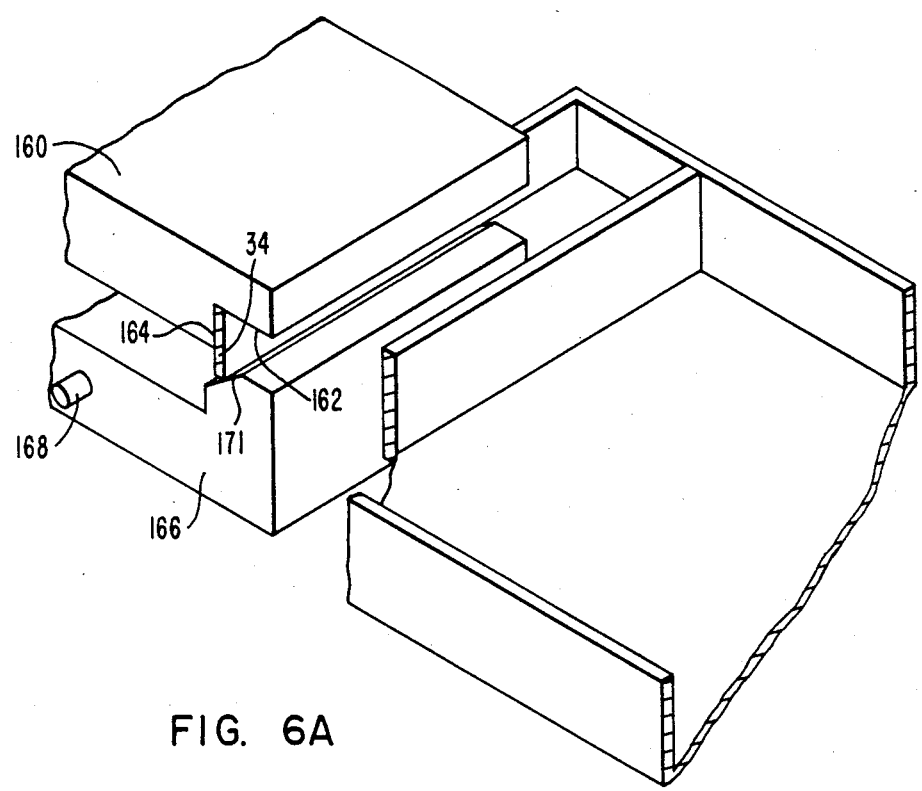
FIG. 6A is a partial view of a handle gripper.

FIG. 6A is a more detailed view of the mechanism which actually engages the handle portion 34 of a typical tray 20 (FIG. 1) to insert and remove the trays from the storage bin. A top member 160 has a horizontal edge 162 which extends over the handle 34 (shown in fragmentary view) and a vertical surface 164 which contacts the front surface of drawer handle 34. A lever mechanism 166 pivots around a bearing 168 causing a sloping edge 171 of the lever mechanism to contact the lower edge of the handle 34. Lever mechanism 166 is rotated about the bearing 168 by a motor 170. This provides means for providing a force in either direction, as required to extract or insert trays in the storage bins. When either engaging or disengaging from a tray, lever mechanism 166 rotates so that member 160 is free to move in position above the handle 34 or move back to lower the tray in the storage bin. Lever mechanism 166 also provides the upward force necessary to lift the trays 20 so that they are free to move above the retaining ledge 21 (FIG. 1) as they move into or out of the storage bins.

Figure 7:
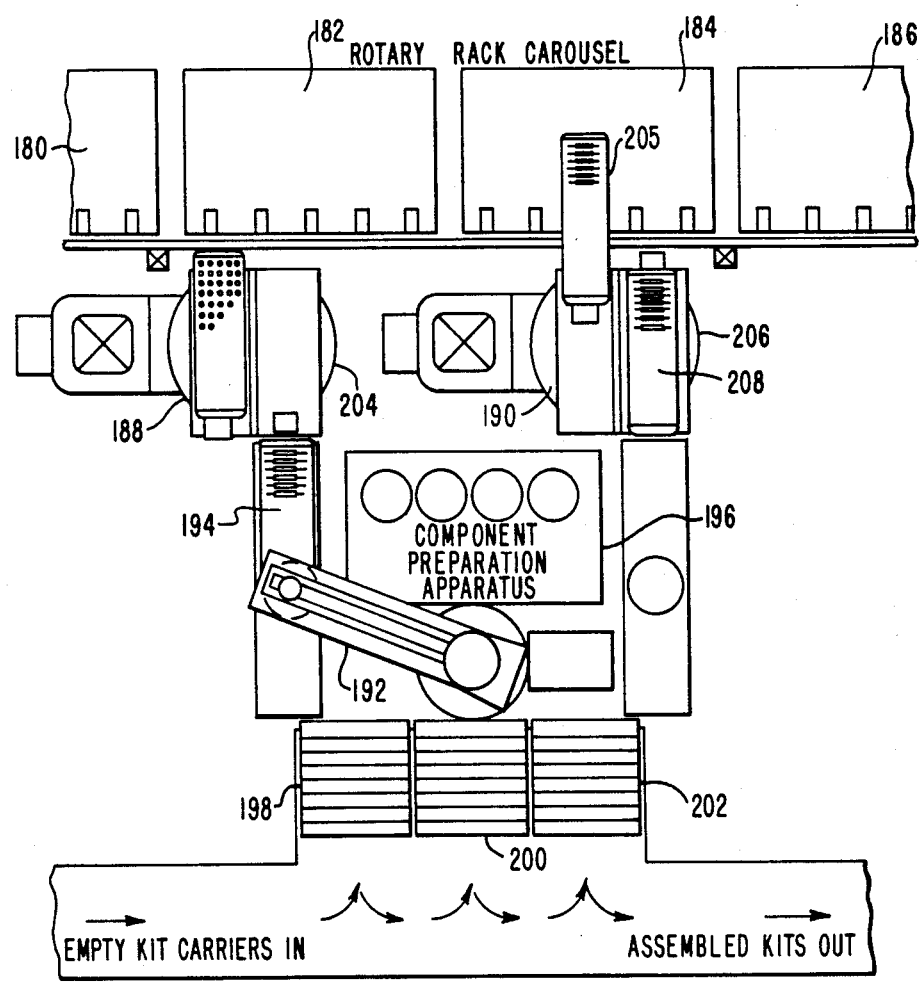
FIG. 7 is a plan view of the system comprising the invention.

All major components of the system are illustrated in plan view in FIG. 7. More specifically four storage bins positioned on a level of the carousel are illustrated at reference numerals 180, 182, 184, 186. This results in only a portion of one level of the carousel being illustrated. Elevators, 188 and 190, are positioned adjacent the carousel.

Trays are removed from storage bins by the elevators, 188 and 190, and transported to the work station where a robot 192 removes components from the tray, for example tray 194. Components are first transferred to component preparation apparatus where the leads are trimmed, bent and prepared as necessary for the final assembly. Other component preparation operations may be included, as required. After the component preparations cycle, the components are transferred to component kits, with typical kits being illustrated at reference numerals 198, 200, 202.

As components are being removed from tray 194, the tray 188 from which components were previously removed is positioned on turntable 204 for return to storage.

The second elevator 190 is illustrated in a position where a typical storage tray 205 is partially withdrawn from a storage bin 184. Assuming that storage tray 205 is the next tray to be required by robot 192 in assembling the component kits, 198, 200 and 202, storage tray 205 will be completely withdrawn onto the turntable mechanism 206, the turntable mechanism 206 will rotate 180° and the previously used tray 208 returned from the work station will be inserted into the slot from which storage tray 205 was extracted. The new tray 205 will be transported to the robot 192 so that components can be removed therefrom in a manner previously described to provide components for kits 198, 200 and 202.

Trays or other suitable containers for the component kits can be supplied to the work station using any convenient means including automated apparatus such as robots.

The entire system as previously described is controlled by a digital computer. Suitable sensors and controls are provided on the carousel and the elevator to provide data to the computer so that the necessary control function can be performed. The robot 192 may be controlled by a separate computer in a conventional manner.

Figure 8:
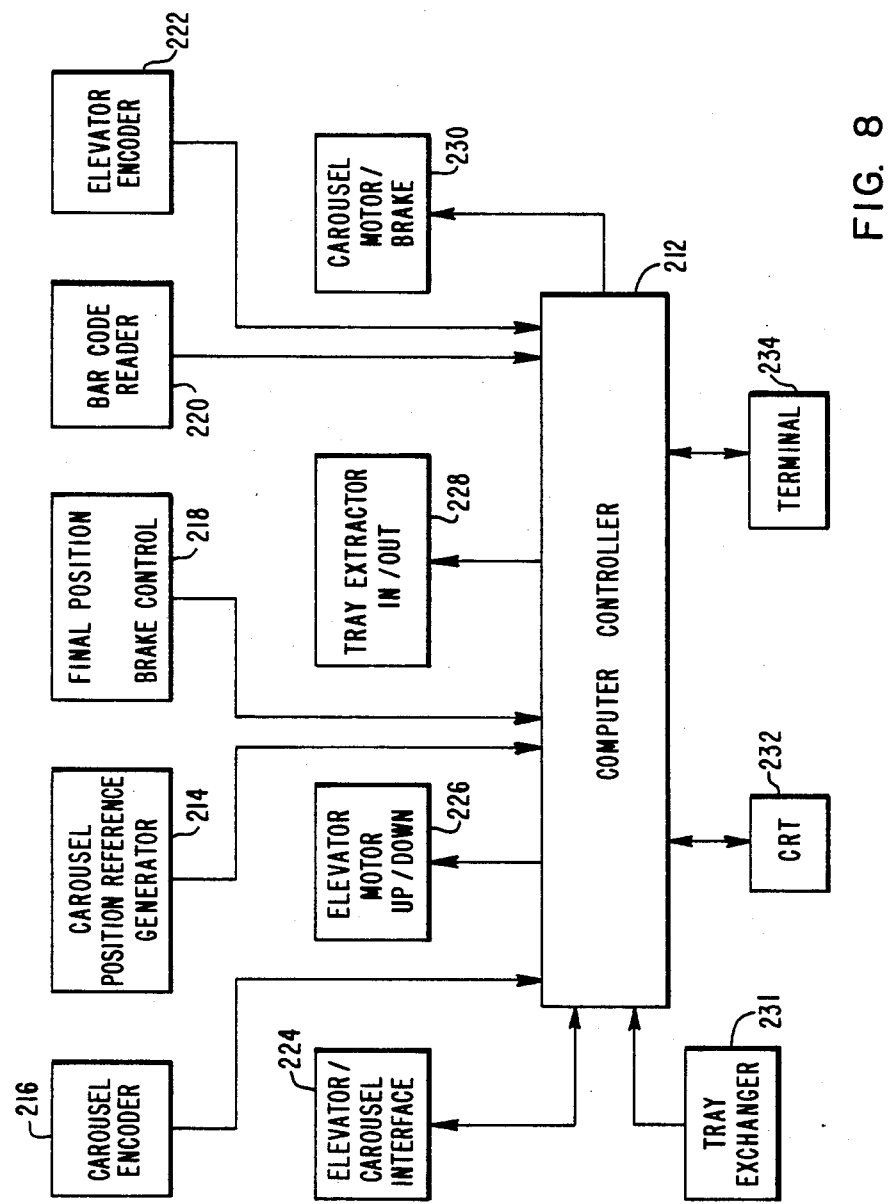
FIG. 8 is a functional block diagram of the system controls.

All major sensors and control functions of the carousels and elevators are shown in FIG. 8 in relation to the computer controller 212. Each of the major sensor and control functions will be first described and then their interrelationships will be discussed with reference to extraction of a typical storage tray.

Each level of the carousels is oval. Therefore some reference is required to each carousel to define a reference point for locating bins and trays on each level. A carousel position reference generator 214 provides a fixed position reference for each level of the carousel. Functionally this is accomplished by a marker on one bin which is detected by a photocell. As the carousel is rotated a pulse is generated each time the marker passes the photocell. Intermediate points along the carousel are identified by a signal generated by a carousel encoder 216 as described below.

Each level of the carousel may not be exactly the same length or rotate at exactly the same speed. Since each storage bin must be located accurately with respect to the elevators a unique position signal must be generated for each level of the carousel. This is accomplished by the carousel encoder 216. Functionally, an encoder is attached to the carousel drive gear box to generate three hundred and sixty (360) pulses for each revolution of the gear box. By counting the number of pulses which occur between two adjacent pulses of the signal generated by the carousel position reference generator 214, any intermediate position around the carousel can be determined.

The position of a particular tray with reference to the elevators cannot be determined with sufficient accuracy with reference to the pulses of the output signal of the carousel position reference generator 214. Therefore a more accurate location marker is required. This function is performed by the final position brake control 218.

Functionally, the final positioning of a tray is accomplished by counting pulses of the output signal of the carousel position reference generator 214. When the tray to be extracted is within approximately thirteen inches of its final location, the rotational speed of the carousel is reduced to approxiately one half its normal value. When the selected tray is less than the width of one tray from its final position a photocell forming a part of the final position brake control 218 begins to search for the marker identifying the tray to be extracted. When this marker is detected a signal is generated indicating that the tray is in its final desired position.

As previously described, each tray includes a bar code identifying the components stored therein. These codes are read by a laser scanner affixed to the turntable mechanism. The bar code reader is indicated functionally at reference numeral 220 with its output signal coupled to the computer controller 212.

Control signals to the elevator drive motor functionally illustrated at reference numeral 226 are provided by the computer controller 212. Encoders 222 on the elevator drive provide position signals permitting the computer controller to determine the position of the elevators at all times.

Proper operation requires that the carousel be disabled while a tray is being either inserted or extracted. Also it is necessary that the elevator be inhibited from inserting or extracting a tray while the carousel is moving. This function is accomplished by the elevator carousel interface 224.

Storage tray insertion and extraction is accomplished by the tray insertion/extraction devices previously described under the control of the computer controller 212. This function is illustrated at reference numeral 228.

As a tray to be extracted moves to its final position in front of the elevator a computer controlled brake stops the carousel at the proper position. This is performed by the carousel motor brake functionally illustrated at reference numeral 230.

As previously discussed, space is provided on each turntable for two trays, i.e. the tray extracted and the tray returned to storage. Rotation of the turntable to the proper position is accomplished by tray exchanger functionally illustrated at reference numeral 231.

System data is displayed using a conventional CRT display 232. All the necessary communication with the computer controller for both programming and operational purposes is provided by a conventional terminal 234.

The operation of the system will be described beginning with an instruction or a decision by the computer controller 212 that a particular storage tray is to be extracted from a selected level of the carousel. Immediately following a decision to extract a particular storage tray, a decision is made as to which of the elevators is to be used. After a determination as to which elevator to use, the computer executes a command to the elevator motor up/down control for the selected elevator causing the elevator to move to the desired height. Based on stored data the computer controller 212 has data specifying the location of each level of the carousel. Based on this data the computer controller initiates the drive motor of the appropriate level of the carousel causing it to move either clockwise or counterclockwise, whichever direction results in less movement, to place the desired tray in the recovery position in front of the recovery elevator. As the carousel approaches a point approximately thirteen inches from the elevator, the carousel drive motor speed is reduced. When a point is reached which is less than the width of one tray from the elevator, a photocell which detects the column marker is enabled. As the column marker passes under the photocell the photocell generates a signal causing the computer controller 212 to energize the carousel brake 230 stopping the carousel at the desired position.

After the tray to be recovered is positioned in front of the recovery elevator, the bar code reader 220 reads the bar code on the front of the tray to determine if the desired component is stored therein. This data is sent to the computer controller 212. When the computer controller 212 confirms that the storage tray does indeed contain the desired component, the computer controller 212 executes a command causing the tray extractor to move into position, grip the handle of the selected tray and pull it onto the turntable. The turntable then rotates and the tray returned from the work station robot is inserted into the slot from which the tray was withdrawn. Bar code reader 220 is used to read the bar code of the tray inserted and the data base of the computer controller 212 is updated to reflect the identity of the tray inserted into the vacated slot.

A move down instruction is issued to the elevator up/down drive motor causing this motor to move the selected tray down to the robot. After the elevator has moved to the robot, the tray extractor mechanism is energized by commands from the computer controller 212 causing the storage tray to move into component recovery position at the work station. Components are recovered from the tray as previously described and a new cycle of the type described above is initiated to recover the next storage tray to be used.

As previously discussed, the operation of both elevators is identical. Therefore, the above description of the operation of the first elevator is equally applicable to the second elevator. When both elevators are used the computer controller 212 also coordinates the two elevators to assure that components are available to the robot so that minimum delays are encountered.

Many modifications of the above system may be made without altering the fundamental concept. For example, the invention has been described with respect to assembling component kits for constructing electronic circuit boards. The same basic concept may be applied to store components for electric motors. Additionally the portions of the system dedicated to the storage and retrieval of components can be used to supply components to a manual assembly station.

It is also obvious that the computer controller can be programmed to perform component handling functions other than assembly of component kits. For example, the robot can be used to move components from one storage tray to another. Inserting functions can be performed by counting components in trays. Self test and maintenance aid type of software is also possible.

We claim:

1. A system for assembling component kits, comprising:
    (A) a multi-level carousel means, each of said multi-levels of said carousel being selectively movable in at least a first direction along a first closed path independently of any other multi-level, each level of said carousel having a plurality of storage bins such that when a selected level of said carousel is rotated, a selected storage bin is selectively positioned with respect to the said first path along which said carousel is rotated;
    (B) first and second elevators in fixed, horizontally spaced-apart relation adjacent said first path,
        each elevator including a vertically movable carriage for movement between selected heights corresponding to selected multi-levels,
        each carriage having a horizontal, rotatable turntable thereon and carrying, first and second retractable-extendable tray engaging means located on one and the opposite sides, respectively, of the axis of rotation of said turntable and equally spaced therefrom, said tray engaging means being in parallel and reversed relation to each other so that movements of retraction and extension are in 180° opposite directions, said rotatable turntables being operable to one and a 180° opposite position in which said movements are perpendicular to said first path;

(C) component handling robot apparatus including a first tray receiving area longitudinally aligned with one of said sides of one of said turntables, and a second tray receiving area longitudinally aligned with one of said sides of the other of said turntables, and further including a robot intermediate said first and second areas and having a working range extending thereto, said working range further including a component collection kit area having kits there located to which components obtained from said first and second areas are delivered by said robot;

(D) means controlling said carousel means, said elevator carriages and turntables, said tray engaging means, and said robot, for positioning a first selected storage bin carried by said carousel at a selected position and for elevating said carriage to a position in which an empty side of said first turntable is aligned with said first selected tray from which components are to be obtained, and for operating one tray engaging means to draw said first selected tray onto said first turntable, and then rotating said first turntable 180° and operating the other tray engaging means on the other side of said first turntable to place a second, at least partly used tray in the location from which said first selected tray was removed, and to then lower said first turntable and to align the empty side thereof with said first tray receiving area and drawing a third tray from said first tray receiving area onto the previously empty side of said first turntable, then rotating said first turntable 180° and placing said first tray on said first tray receiving area, and then repeating the operation beginning with positioning a selected storage bin at a selected position, operating said second elevator carriage and turntable and associated parts in the same sequence, but in alternating relation to the first carriage, and in connection with the second tray receiving area so at least one of the first and second tray receiving areas has a tray thereon at any given time, and operating said robot to remove components from said first and second trays alternately and to place them in said component collection kits.

2. A system according to claim 1 wherein:

said working range for said robot further includes a component preparation apparatus area to which components obtained from said first and second areas may be selectively delivered from component preparation, before delivery of the components to the kits.

* * * * *